United States Patent [19]

Möller et al.

[11] Patent Number: 5,164,017

[45] Date of Patent: Nov. 17, 1992

[54] METHOD FOR CLEANING REACTORS USED FOR GAS-PHASE PROCESSING OF WORKPIECES

[76] Inventors: Rainer Möller, Stephanstrasse 55, Dresden DDR-8023; Dietmar Resch, Ludwig-Kossuth-Strasse 25, Dresden DDR-8090; Lutz Fabian, Zschertnitzer Weg 8, Dresden DDR-8020, all of German Democratic Rep.

[21] Appl. No.: 688,372

[22] Filed: Apr. 19, 1991

Related U.S. Application Data

[63] Continuation-in-part of Ser. No. 378,547, Jul. 11, 1989, abandoned.

[30] Foreign Application Priority Data

Aug. 12, 1988 [DD] German Democratic Rep. ... 318879

[51] Int. Cl.⁵ .............................................. B08B 9/093
[52] U.S. Cl. .................................. 134/22.18; 134/37; 29/25.01
[58] Field of Search ............... 156/646; 134/22.18, 134/37; 118/719, 720, 723, 50.1; 204/192.3, 192.32; 29/25.01, 25.02, 25.03; 34/72, 78

[56] References Cited

U.S. PATENT DOCUMENTS

| | | | |
|---|---|---|---|
| 4,828,224 | 5/1989 | Crabb et al. | 118/715 |
| 4,842,683 | 6/1989 | Cheng et al. | 156/646 |
| 4,874,464 | 10/1989 | Goodwin et al. | 156/646 |

Primary Examiner—Olik Chaudhuri
Assistant Examiner—G. Fourson
Attorney, Agent, or Firm—Jordan and Hamburg

[57] ABSTRACT

A method for cleaning reactors for the gas-phase processing of workpieces, particularly in the field of semiconductor technology and more particularly in the field of coating semiconductor substrates by means of chemical deposition processes, with less effort entails providing the reactor with a gas permeable inner wall within the usual gas impermeable outer wall, the inner wall surrounding a chamber for coating a workpiece by means of a chemical deposition process, plenums being formed between the inner and outer walls, and further with conduit means communicating between the exterior of the reactor and the plenums and conduit means communicating between the exterior of the reactor and the inner chamber, and effecting a cleaning cycle in which an etching gas is conducted through the inner chamber by being introduced into the reactor through one of the aforementioned conduit means and withdrawn from the reactor through another of the aforementioned conduit means.

2 Claims, 1 Drawing Sheet

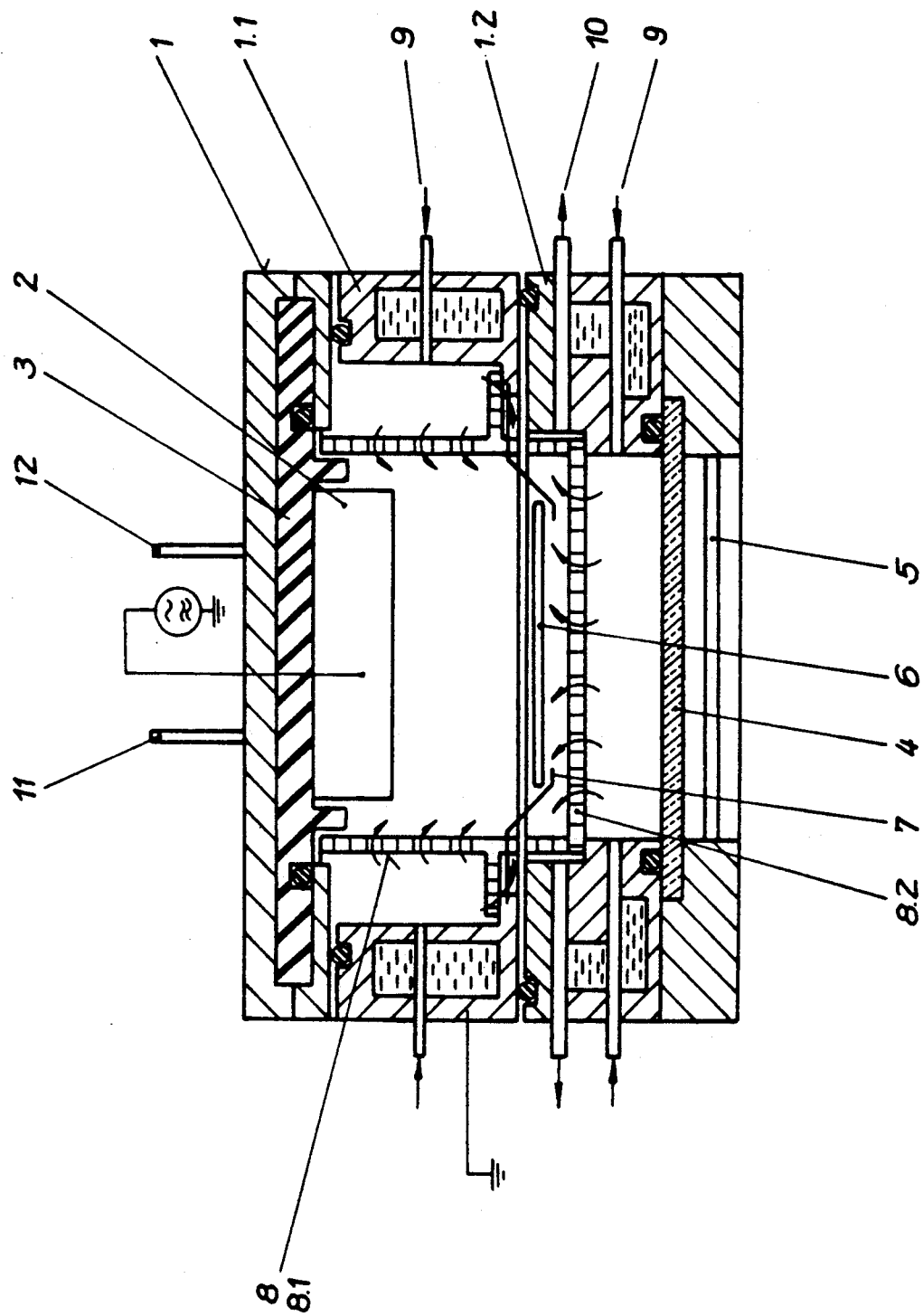

METHOD FOR CLEANING REACTORS USED FOR GAS-PHASE PROCESSING OF WORKPIECES

This application is a continuation-in-part, of application Ser. No. 07/378,547, filed Jul. 11, 1989, now abandoned.

BACKGROUND OF THE INVENTION

This invention relates to a method for cleaning reactors for the gas-phase processing of workpieces. In particular, the invention is directed to the in situ cleaning of reactors used for processing single disks.

It is customary to disassemble contaminated reactors, which are used for the gas-phase processing of workpieces, and to clean them by wet chemical means. This represents a considerable expense, particularly in the case of reactors, which are constructed as vacuum vessels. For this reason, so-called in situ solutions have been provided, which permit a reactor to be cleaned without being disassembled. For this purpose, a suitable gas mixture is introduced through existing gas inlets. Under the conditions existing in the reactor, this gas mixture causes the contaminated reactor parts to be cleaned by an etching process. This method is customary particularly with reactors used to carry out plasma-aided CVD (chemical deposition from the vapor phase) processes.

The gas inlet systems, which during the deposition process are used to supply the gaseous starting materials (process gas) for the layer that is to be deposited, are charged with an etching gas such as $CF_4/O_2$ or $NF_3$ during the in situ cleaning step. The cleaning of the interior parts of the reactor by etching is carried out under the action of an HF plasma and an elevated temperature in the reactor.

It is a disadvantage of this method that the gas paths, used to introduce and exhaust the etching gas, are the same as those used to realize the processing of the substrate. They are designed so that the effect of the substrate processing takes place as far as possible only at the surface of the substrate and not anywhere else in the reactor (for example, the gas nozzle above the substrate).

However, it may be noted that the so-called dead spaces of the reactor, through which the process gas does not flow and which are not flushed, are contaminated most quickly. For this reason, only a limited cleaning effect can be attained by the above described conventional method of in situ cleaning or the etching process must be carried out for a disproportionally long time. The optimization of the process gas paths through the reactor to achieve the optimum processing effect on the surface of the substrate is in conflict with the requirements of the optimum processing effect at the reactor walls during the step of in situ cleaning by etching.

It is an object of the invention to reduce the effort involved in cleaning reactors for the gas-phase processing of work pieces.

SUMMARY OF THE INVENTION

According to the invention there is provided a method for effective, in situ cleaning of reactors for the chemical gas-phase processing of workpieces.

More particularly, this is accomplished by passing a suitable etching gas or etching gas mixture through the reactor over the process gas paths, which have been provided for processing of the substrate, and alternatingly or simultaneously over a second gas path, which serves to create a flushing gas cushion at the reactor wall during the processing of the substrate. This second gas path is formed according to the invention by providing a reactor for the gas-phase processing of workpieces with a gas-permeable second wall system and by providing exhaust channels which are associated with this second wall system but are spatially and functionally separate from the process gas exhaust system.

The gas-permeable second wall system is disposed at a certain distance from the outer wall of the reactor and thus forms filling cavities or plenums into which a flushing gas flows during the processing of the substrate and an etching gas or etching gas mixture during the cleaning cycle. The process and apparatus parameters, such as the linear and volumetric rates of introduction of the etching gas or etching gas mixture into the plenums, the volumetric capacities of the plenums, the permeability of the second wall system and so forth are so selected that a major proportion, i.e., as great a proportion as possible, of the etching gas or etching gas mixture emerging through the gas permeable second wall system flows parallel to the respective gas permeable walls through which the etching gas or etching gas mixture emerges; once one of ordinary skill in the art is informed of the objective of having as great a proportion as possible of the etching gas or etching gas mixture flow parallel to the respective gas permeable walls through which the etching gas or etching gas mixture emerges, it is a routine matter for one of ordinary skill in the art to select appropriate apparatus and process parameters for attainment of this end.

In an embodiment of the invention, the etching gas or etching gas mixture can be introduced over the process gas inlet system into the reactor and exhausted over the flushing gas exhaust system from the reactor or introduced over the flushing gas inlet system and exhausted over the process gas exhaust system from the reactor.

In a further variation of the method of the invention, the workpiece that is to be processed is removed or replaced by a similarly shaped, but perforated article during the cleaning-by-etching process. By these means, further gas paths are opened up to spaces in the reactor which otherwise would not be flushed.

BRIEF DESCRIPTION OF THE DRAWING

The invention is described in greater detail by reference to a drawing, which is a section through a specific embodiment of an apparatus with which the method of the invention can be carried out.

The apparatus, which comprises a liquid-cooled outer, first wall 1 divided into an upper part 1.1 and lower part 1.2, is intended for the plasma chemical coating of a substrate 6, on a substrate support 7, with $Si_3N_4$. Near the bottom of part 1.2 are a radiation window 4 and a radiant heater 5. A gas permeable second wall 8, having an upper part 8.1 and a lower part 8.2, is spaced from the first wall 1. The apparatus also includes flushing gas inlets 9 and exhaust channels or outlets 10, which create a cushion of flushing gas on the inner surface of the wall 8 during the processing of the substrate 6. During the deposition process, a plasma is burning between the HF electrode 2, which is mounted in an HF insulator 3, and the substrate 6, the former which at the same time serves, in conjunction with process gas inlet 11 and a waste gas exhaust system 12, for supplying process gas and exhausting waste gas, respectively and the substrate 6. The process gas flow is optimized so that essentially only the substrate is coated. Nevertheless, the substrate support 7, the HF electrode 2 and the various other parts of the inside of the reactor are affected by a coating, which acts as an impurity.

After the deposition of approximately 1 micron of $Si_3N_4$, the reactor is subjected to an in situ cleaning process. For this purpose, the reactor is pumped out to a vacuum of about $10^{-3}$ Pa with a rotary slide valve vacuum pump, which has a pumping capacity of 30 $m^3$/hour and is connected to the reactor. After that, $NF_3$ is let in over the gas jet, which is integrated in the HF electrode 2, so that a pressure of about 150 Pa develops. Over the HF generator, 450 W power with a frequency of 100 KHz are fed in. At the same time, the substrate is heated to about 500° C. by means of the radiant heater 5 and the radiation window 4.

The $NF_3$ is decomposed in the plasma to fluoride ions, atomic fluorine and nitrogen. The fluorine reacts with the $Si_3N_4$, forming volatile silicon fluoride and nitrogen. These waste products are transported by the vacuum pump through the process gas exhaust system and out of the reactor. After 2 minutes, the $NF_3$ gas path over the HF electrode 2 is interrupted and switched over the flushing gas inlet system 9 and the flushing gas exhaust system 10, respectively. While the above conditions are being maintained, etching is continued for 1 minute in this state. After that, the flushing gas exhaust system 10 is interrupted, the process gas exhaust system opened up and the etching process continued for a further minute. After that, the gas supply system and the HF power supply are switched off and the reactor is pumped out to about $10^{-3}$ Pa. Thereupon the reactor is filled over the flushing gas supply system 9 and the process gas supply system with nitrogen to a pressure of about $4 \times 10^{-3}$ Pa. After a further evacuation to about $10^{-3}$ Pa, the radiant heater is switched off and the reactor is vented to atmospheric pressure with nitrogen. The cleaned reactor is then available for further coating cycles.

The advantage of the inventive solution lies therein that the etching gas or etching gas mixture for the cleaning-by-etching process flows through the reactor along different paths. Consequently, the areas, which are not in the process gas path, which has been optimized for processing the substrate, but are nevertheless contaminated, are also optimally covered by the cleaning-by-etching process.

What we is claim is:

1. A method of cleaning, by means of an etching medium in the form of an etching gas or etching gas mixture, a reactor in which the gas phase processing of a workpiece has been effected, the reactor comprising a reactor vessel having outer and inner walls with plenums formed therebetween, the inner wall laterally bounding a chamber including means for supporting the workpiece in the chamber, the outer wall being gas impermeable and the inner wall being gas permeable, first gas inlet and gas outlet means which in said gas phase processing are used respectively for conducting into the chamber a gas for treating the workpiece and for conducting out of the chamber waste gas, second gas inlet means which in said gas phase processing are used for conducting a flushing gas into the plenums, the flushing gas from one of said plenums passing through the inner wall and forming a flushing gas cushion on the inner surface of the inner wall, and second gas outlet means which in said gas phase processing are used for conducting the flushing gas out of the chamber, the cleaning method comprising feeding the etching medium through at least one of the following two paths, (1) into the vessel through the second gas inlet means, wherefrom the etching medium flows into said one plenum, then through said inner wall and then parallel to the inside surface of said inner wall, and out of the vessel through the first gas outlet means and (2) into the vessel through the first gas inlet means, wherefrom the etching medium flows through said inner wall, then into said one plenum, and out of the vessel through the second gas outlet means.

2. A method according to claim 1, further comprising, prior to said feeding of the etching medium, positioning on the means for supporting the workpiece a like shaped but perforated article, thereby to aid in distributing the etching medium.

* * * * *